United States Patent [19]

Seymour et al.

[11] Patent Number: 4,685,108
[45] Date of Patent: Aug. 4, 1987

[54] OPTICAL MULTIVIBRATOR

[75] Inventors: Robert J. Seymour, Wellesley Hills; Jia-ming Liu, Arlington, both of Mass.; Ying C. Chen, Closter, N.J.

[73] Assignee: GTE Laboratories Incorporated, Waltham, Mass.

[21] Appl. No.: 751,660

[22] Filed: Jul. 3, 1985

[51] Int. Cl.⁴ ............................................. H01S 3/098
[52] U.S. Cl. .......................................... 372/19; 372/8
[58] Field of Search .......................... 372/8, 44, 45, 19

[56] References Cited

U.S. PATENT DOCUMENTS 4,483,004  11/1984  Inaba et al. ............................ 372/44
4,518,934   5/1985  Venkatesan ......................... 332/7.51
4,612,645   9/1986  Liu et al. ................................ 372/45

Primary Examiner—James W. Davie
Assistant Examiner—Georgia Y. Epps
Attorney, Agent, or Firm—Fred Fisher

[57] ABSTRACT

An optical square wave multivibrator includes a semiconductor laser that operates near the polarization transition temperature in a pure TM mode at low injection currents and switches operation to a pure TE mode at high injection currents, and vice versa. Near such temperature, the semiconductor laser experiences large hysteresis loops with high contrast ratio in its polarization-resolved power vs current characteristic while total power exhibits only slight change in hysteresis. The switching behavior of the TE mode is complementary to that of the TM mode. The laser is biased within the hysteresis loops. A current pulse applied in one direction to the laser causes it to provide a TE mode laser output, whereas a current pulse applied in the other direction causes the laser to provide a TM mode laser output. Optical delay line means are coupled to the laser so as to be responsive to an initiation of light in a TE mode for causing a current pulse to be applied to the laser to switch it to the TM mode laser output and to be responsive to cessation of light in the TE mode from the laser for causing a current pluse to be applied in one direction to cause the laser to switch to TE mode, thereby resulting in a polarization-bistable square wave output.

7 Claims, 3 Drawing Figures

OPTICAL MULTIVIBRATOR

CROSS-REFERENCE TO RELATED APPLICATION

This application is related to a pending U.S. patent application Ser. No. 751,707 entitled "Optical Logic/Memory Apparatus", filed concurrently herewith, July 3, 1985 by Jia-ming Liu and Ying Chih Chen, two of the three co-inventors of this instant application. Ser. No. 751,707 is a continuation-in-part application of Ser. No. 683,776, filed Dec. 19, 1984 for FAST POLARIZATION-SWITCHABLE SEMICONDUCTOR LASERS, now U.S. Pat. No. 4,612,645, issued Sept. 16, 1986.

BACKGROUND OF THE INVENTION

1. Field of the Invention

This invention relates to optical multivibrators and, in particular, to optical square-wave multivibrators. Accordingly, it is a general object of this invention to provide new and improved multivibrators of such character.

2. General Background

Optical square waves such as digital optical signals are suitable for modulation to carry information in optical signal processing systems. Optical square waves, such as optical clock pulses, can be used as timing signals.

One prior art method of generating optical square waves involves driving a semiconductor laser ON and OFF with electrical square-wave current. This method, however, suffers from slow response because its speed is limited by the associated electrical square-wave generator and by the carrier lifetime of the semiconductor laser. Furthermore, a separate electrical circuit for the generation of the electrical square-wave current was required.

Another prior art method of generating optical square waves involves chopping a light beam by mechanical, electrical, or electro-optic means. However, this method, basically, involves modulating a light beam instead of an active square-wave light source. Although electro-optic modulation can be very fast, other types of modulation are slow in response.

SUMMARY OF THE INVENTION

Another object of this invention is to provide a new and improved optical square-wave multivibrator utilizing a polarization-bistable semiconductor laser and an optical feedback delay line.

Still another object of this invention is to provide a new and improved self-sustained active optical multivibrator which generates optical square waves with a repetition rate determined by an optical feedback delay.

Yet another object of this invention is to provide a new and improved optical square-wave multivibrator which requires only a direct current power supply and does not require any other optical or electrical signal inputs.

Still yet another object of this invention is to provide a new and improved optical square-wave multivibrator that has very high switching speed and high ON and OFF ratios.

In accordance with one aspect of the invention, an optical square-wave multivibrator includes a semiconductor laser that operates near the polarization transition temperature where the laser operates in a pure TM$_{oo}$ mode at low injection currents and switches operation to a pure TE$_{oo}$ mode at high injection currents and, vice versa, having large hysteresis loops with a high contrast ratio in its polarization-resolved power versus current characteristic while total power exhibits only slight change in hysteresis. The switching behavior of the TE mode is complementary to that of the TM mode. Means are provided for biasing the laser to operate within the hysteresis loops. Suitable means apply a current pulse in one direction to the laser to cause it to provide a TE mode laser output, and apply a current pulse in the opposite direction to cause the laser to provide a TM mode laser output. Optical delay line means, having a delay time T, coupled to the laser so as to be responsive to initiation of light in the TE$_{oo}$ mode therefrom, causes the means for applying a current pulse to apply an appropriate pulse in the opposite direction to cause the laser to switch to the TM mode laser output. Also, the delay line means is coupled to the laser so as to be responsive to cessation of light in the TE$_{oo}$ mode of the laser for causing the means for applying a current pulse to apply a current pulse in the one direction to cause the laser to switch to the TE mode. This results in a polarization-bistable square-wave output having a period 2T with equal ON and OFF durations T.

In accordance with certain features of the invention, the means for applying a current pulse includes a serially coupled optoelectronic switching means and a capacitor for coupling across a direct current voltage source and the laser. Thus, upon receipt of light applied thereto, the optoelectronic switching means is highly conductive. Further, the optoelectronic switching means is highly insulative in the absence of light applied thereto. The laser can be an InGaAsP/InP laser, the term "near the polarization transition temperature" can include a range from 186.7° K. to below 195.2° K., the hysteresis loops can have widths in the range of about 1 mA to 23 mA. The laser, specifically, can operate at a temperature of 193.0° K.; the loops can have a width of 3.5 mA.

In accordance with another aspect of the invention, an optical square-wave multivibrator includes a semiconductor laser that operates near the polarization transition temperature in a pure TM$_{oo}$ mode at low injection currents and switches operation to a pure TE$_{oo}$ mode at high injection currents, and vice versa. It has large hysteresis loops with a high contrast ratio in its polarization-resolved power versus current characteristic while total power exhibits only slight change in hysteresis. The switching behavior of the TE mode is complementary to that of the TM mode. The laser can be biased to operate within the hysteresis loops. Included are means for applying a current pulse in one direction to the laser to cause it to provide a TE mode laser output, and for applying a current pulse in the opposite direction to cause it to provide a TM mode laser output. First optical delay line means, having a delay time T$_1$, is coupled to the laser so as to be responsive to emission of light in the TE$_{oo}$ mode, for coupling to the means for applying a current pulse. Further, second optical delay line means, having a delay time T$_2$, is coupled to the laser so as to be responsive to emission of light in the TM$_{oo}$ mode, for coupling to the means for applying a current pulse. Thus, the initiation of light coupled to the applying means causes the applying means to apply a current pulse in the opposite direction to cause the laser to switch to the TM mode laser output, and whereby the cessation of light coupled to the applying means causes the applying means to apply a current pulse in the one direction to cause it to switch to the TE mode laser output, thereby resulting in a polarization-bistable square wave output.

In accordance with certain features, the optical square-wave multivibrator has optical delay line means with delay times T1 and T2, such that $T_1<T_2<2T_1$, whereby the multivibrator provides optical output signals having a period $T_2$. The laser provides a square-wave TE mode signal having an ON duration $T_1$ and an OFF duration of $T_2-T_1$ and provides a square-wave TM mode signal having an ON-duration of $T_2-T_1$ and an OFF-duration $T_1$. In another feature, the relationship can be such that $2T_1<T_2<3T_1$ whereby the laser provides a polarization-bistable square-wave output having a period $2T_1$ with equal ON and OFF durations $T_1$.

BRIEF DESCRIPTIONS OF THE DRAWINGS

Other objects, advantages, and features of this invention, together with its construction and mode of operation, will become more apparent from the following description, when read in conjunction with the accompanying drawings, in which.

DESCRIPTION OF PREFERRED EMBODIMENTS

Figure 1:
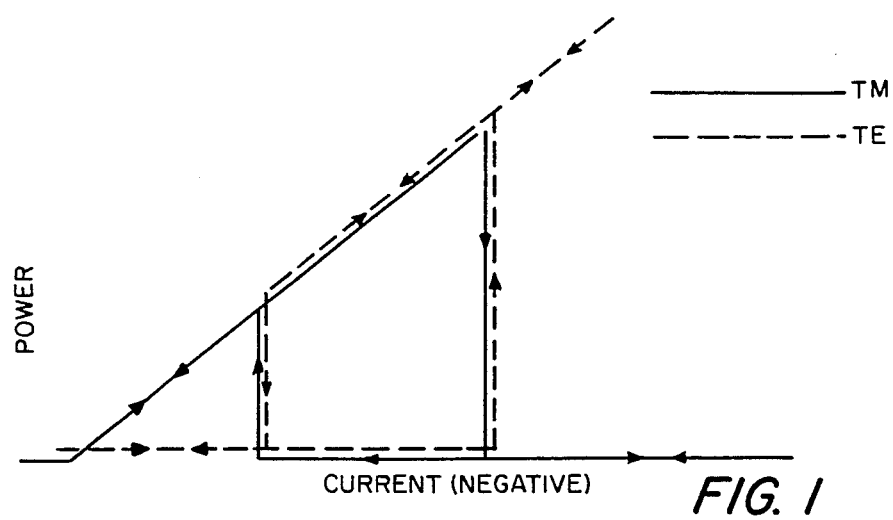
FIG. 1 is a power vs current characteristic of a polarization-bistable semiconductor laser operated in the polarization-bistable mode in accordance with this invention.

The circuits of optical multivibrators described herein are based on polarization-bistable semiconductor lasers. Such circuits are compatible with monolithic integration and are capable of switching within one nanosecond. Referring to FIG. 1, there is shown a powercurrent characteristic of a semiconductor laser that operates near the polarization transition temperature. The polarization transition temperature is one where the laser operates in a pure $TM_{oo}$ mode at low injection currents and can switch operation to a pure $TE_{oo}$ at high injection currents, and vice versa. Large hysteresis loops exist near the polarization transition temperature having high contrast ratio in its polarization-resolved power vs current characteristic while total power exhibits only slight change in hysteresis. The switching behavior of the TE mode is complementary to that of the TM mode.

As illustrated in FIG. 1, when current is near zero, the power expended in the laser is also near zero. As current is applied to the laser diode, in the negative direction, light is emitted therefrom in a transverse magnetic (TM) mode while substantially no light is emitted in the transverse electric (TE) mode, as indicated by the solid and dotted lines respectively. As current is further negatively increased, the output of the laser abruptly switches from its TM mode of polarization to the TE mode of operation, and as current is further increased in the negative direction, as shown from the drawing, the power emitted by the laser is all TE oriented while light of the TM mode is essentially nil.

As the negative current that is applied to the laser diode is reduced, the TE mode polarized light from the laser diode continues to be emitted, until, at an absolute value of current noticeably lower than that which required the laser diode to switch from the TM mode to the TE mode was reached, the laser diode switches to TM modal operation. As indicated in the drawing, a hysteresis effect is effected. Switching from TE polarization to TM polarization occurs at a lower absolute value than switching from TM polarization to TE polarization.

A suitable laser for use in our invention can include one having a double buried heterostructure, such as an InGaAsP/InP laser. By way of example, and not by way of limitation, the laser can be operated near the polarization transition temperature within a range from 186.7° K. to below 195.2° K. The hysteresis loops can have the width in a range of about 1 mA to 23 mA. With one example, preferably, the laser should operate at a temperature of 193.0° K. where the loops have a width of 3.5 mA.

Figure 2:
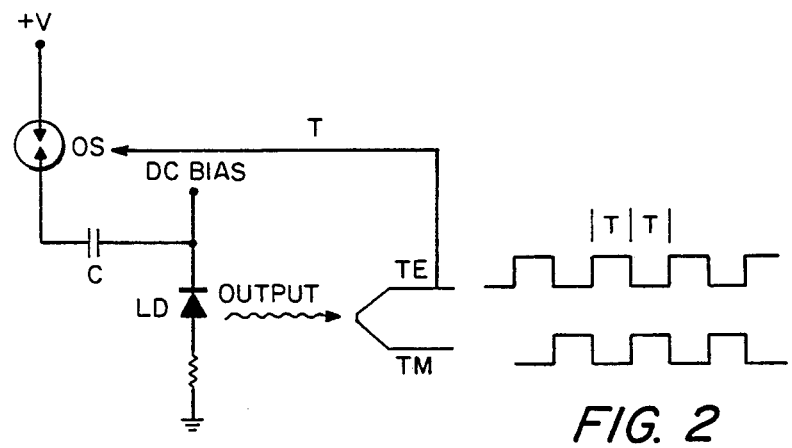
FIG. 2 is a circuit diagram of an optical square-wave multivibrator having equal ON and OFF durations, in accordance with one embodiment of the invention.

One embodiment of our invention showing a circuit of an optical square-wave multivibrator is depicted in FIG. 2. A polarization-bistable laser LD is biased in the middle of its polarization hysteresis loop (as depicted in FIG. 1). Its TE optical output signal is fed back through an optical delay line to an optoelectronic switch OS that is coupled to a d.c. voltage source. The optical feedback has a time delay T. The output of the optoelectronic switch OS, differentiated by a capacitor C, is fed to the polarization-bistable laser LD. When the TE polarization output is turned ON at a time, t, the TE feedback turns on the optoelectronic switch OS at time $t+T$. Then, a positive impulse is propagated through the capacitor C, triggering the polarization-bistable laser LD to switch into a TM polarization mode of operation. Thus, the TE polarization mode output is turned OFF at time $t+T$, thereby turning the optoelectronic switch OS off at time $t+2T$ (after another time delay T).

When the optoelectronic switch OS is turned off, a negative impulse is propagated through the capacitor C to switch the polarization-bistable semiconductor laser LD into TE polarization operation. Then, the TE polarization output is turned on again at the time $t+2T$. This operation results in a square-wave output having a period 2T with equal on and off duration times T, as shown in FIG. 2.

Figure 3:
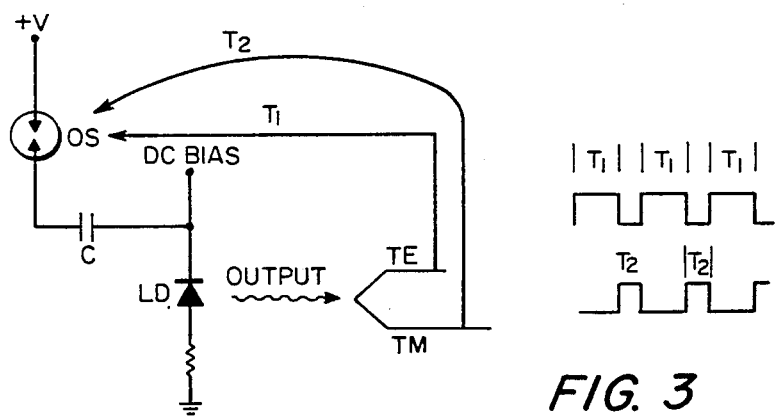
FIG. 3 is a circuit of another optical square-wave multivibrator, having unequal ON and OFF durations, in accordance with another embodiment of the invention.

An optical square-wave generator circuit having unequal ON and OFF durations is depicted in FIG. 3. Therein, both TE and TM output signals are fed back to the same optoelectronic switch OS along different delay lines having different time intervals. The TE and TM feedback lines have time delays $T_1$ and $T_2$, respectively. In one case, when $T_1<T_2<2T_1$, the optical output signals have a time period of $T_2$. The TE mode signal has an ON duration time of $T_1$ and an OFF duration time of $T_2-T_1$. The TM modal signal, being complementary to the TE modal signal, has an ON duration of $T_2-T_1$ and an OFF duration of $T_1$. In another case, when $2T_1<T_2<3T_1$, the output is the same as a single TE feedback, as shown in FIG. 2, having a time $T_1$. Both TE and TM output signals have a period of $2T_1$, with equal ON and OFF duration times $T_1$.

When $T_2$ is larger than $3T_1$, the output patterns will repeat the previous two cases.

Various modifications can be made to this invention without departing from the spirit and scope of applicants' invention.

What is claimed is:

1. An optical square wave multivibrator comprising
   a semiconductor laser operating near the polarization transition temperature wherein said laser operates in a pure $TM_{oo}$ mode at low injection currents and switches operation to a pure $TE_{oo}$ mode at high injection currents, and vice versa, having large hysteresis loops with a high contrast ratio in its polarization-resolved power versus current characteristic while total power exhibits only slight change in hysteresis, the switching behavior of the TE mode being complementary to that of the TM mode;
   means for biasing said laser for operation within said hysteresis loops;
   means for applying a current pulse in one direction to said laser to cause said laser to provide a TE mode laser output, and for applying a current pulse in the opposite direction to cause said laser to provide a TM mode laser output; and
   optical delay line means, having a delay time T, coupled to said laser so as to be responsive to initiation of light in said $TE_{oo}$ mode therefrom for causing said applying means to apply a current pulse in said opposite direction to cause said laser to switch to said TM mode laser output, and so as to be responsive to cessation of light in said $TE_{oo}$ mode from said laser for causing said means for applying a current pulse to apply a current pulse in said one direction to cause said laser to switch to said TE mode,
   resulting in a polarization-bistable square wave output of period 2T with equal on and off duration T.

2. The multivibrator as recited in claim 1, wherein said means for applying a current pulse includes
   a serially coupled optoelectronic switching means and capacitor for coupling across a direct current voltage source and said laser,
   wherein said optoelectronic switching means is highly conductive upon receipt of light applied thereto, and wherein said optoelectronic switching means is highly insulative in the absence of light applied thereto.

3. The multivibrator as recited in claim 2 wherein said laser is an InGaAsP/InP laser; near the polarization transition temperature includes a range from 186.7° K. to below 195.2° K.; and said hysteresis loops having widths in the range of about 1 mA to 23 mA.

4. The multivibrator as recited in claim 3 wherein said laser operates at a temperature of 193.0° K. and said loops have a width of 3.5 mA.

5. An optical square wave multivibrator comprising
   a semiconductor laser operating near the polarization transition temperature wherein said laser operates in a pure $TM_{oo}$ mode at low injection currents and switches operation to a pure $TE_{oo}$ mode at high injection currents, and vice versa, having large hysteresis loops with a high contrast ratio in its polarization-resolved power versus current characteristic while total power exhibits only slight change in hysteresis, the switching behavior of the TE mode being complementary to that of the TM mode;
   means for biasing said laser for operation within said hysteresis loops;
   means for applying a current pulse in one direction to said laser to cause said laser to provide a TE mode laser output, and for applying a current pulse in the opposite direction to cause said laser to provide a TM mode laser output;
   first optical delay line means, having a delay time $T_1$, coupled to said laser so as to be responsive to emission of light in said $TE_{oo}$ mode therefrom, for coupling to said means for applying a current pulse; and
   second optical delay line means, having a delay time $T_2$, coupled to said laser so as to be responsive to emission of light in said $TM_{oo}$ mode therefrom, for coupling to said means for applying a current pulse;
   whereby the initiation of light coupled to said applying means causes said applying means to apply a current pulse in said opposite direction to cause said laser to switch to said TM mode laser output, and whereby the cessation of light coupled to said applying means causes said applying means to apply a current pulse in said one direction to cause said laser to switch to said TE mode laser output,
   resulting in a polarization-bistable square wave output.

6. The optical square wave multivibrator as recited in claim 5 wherein $T_1 < T_2 < 2T_1$ whereby
   said multivibrator provides optical output signals having a period of $T_2$,
   said laser provides a square wave TE mode signal having an ON-duration of $T_1$ and an OFF duration of $T_2 - T_1$, and provides a square wave TM mode signal having an ON-duration of $T_2 - T_1$, and an OFF duration of $T_1$.

7. The optical square wave multivibrator as recited in claim 5 wherein $2T_1 < T_2 < 3T_1$, whereby
   said laser provides a polarization-bistable square wave output having a period $2T_1$, with equal ON and OFF duration $T_1$.

* * * * *